(12) United States Patent
Jinagar et al.

(10) Patent No.: US 8,477,896 B2
(45) Date of Patent: Jul. 2, 2013

(54) STRUCTURE FOR WINDOW COMPARATOR CIRCUIT FOR CLOCK DATA RECOVERY FROM BIPOLAR RZ DATA

(75) Inventors: Santoshkumar Jinagar, Bangalore (IN); Animesh Khare, Bangalore (IN); Ravi Lakshmipathy, Bangalore (IN); Narendra K. Rane, Bangalore (IN); Umesh Shukla, Bangalore (IN); Pradeep K. Vanama, Bangalore (IN)

(73) Assignee: International Business Machines Corporation, Armonk, NY (US)

(*) Notice: Subject to any disclaimer, the term of this patent is extended or adjusted under 35 U.S.C. 154(b) by 260 days.

(21) Appl. No.: 12/985,032

(22) Filed: Jan. 5, 2011

(65) Prior Publication Data

US 2012/0170698 A1    Jul. 5, 2012

(51) Int. Cl.
H04L 7/02    (2006.01)

(52) U.S. Cl.
USPC ........... 375/359; 375/355; 375/371; 375/373; 375/376; 370/503; 370/516; 713/400; 713/500; 713/503; 713/600

(58) Field of Classification Search
USPC .......... 375/359, 355, 371, 373, 376; 370/503, 370/516; 713/400, 500, 503, 600
See application file for complete search history.

(56) References Cited

U.S. PATENT DOCUMENTS

| | | | |
|---|---|---|---|
| 4,237,387 A | 12/1980 | Devendorf et al. | |
| 4,409,628 A * | 10/1983 | Frimet et al. | 360/73.09 |
| 4,696,016 A | 9/1987 | Rozema et al. | |
| 5,047,735 A | 9/1991 | Meline | |
| 5,689,530 A | 11/1997 | Honaker, Jr. | |
| 5,864,250 A | 1/1999 | Deng | |
| 5,969,631 A * | 10/1999 | Ammler et al. | 370/514 |
| 6,016,463 A | 1/2000 | Ng | |
| 6,255,857 B1 | 7/2001 | Iliasevitch | |
| 6,317,005 B1 * | 11/2001 | Morel et al. | 331/20 |
| 6,324,236 B1 | 11/2001 | Bladh | |
| 6,369,622 B1 | 4/2002 | Lim et al. | |
| 7,123,678 B2 | 10/2006 | Hendrickson | |
| 7,546,095 B2 * | 6/2009 | Arimura | 455/112 |
| 7,705,639 B1 * | 4/2010 | Pirooz | 327/113 |

FOREIGN PATENT DOCUMENTS

| | | |
|---|---|---|
| JP | 06-152322 | 5/1994 |
| JP | 2004253919 | 9/2004 |

OTHER PUBLICATIONS

Aghababa, et al., "A High Speed and Power Controlled CMOS Edge Detector for 2.5 Gb/s Clock Recovery Circuit", University of Tehran, Iran University of Science and Technology Tehran, Iran; pp. 1-4; Microwaves, Radar & Wireless Communications, 2006. MIKON 2006; Publication Year: 2006, pp. 881-884.

Huang, et al., "A Programmable Dual Hysteretic Window Comparator", RichTek Technology Corporation, Hsinchu, Taiwan, R.O.C.; Department of Electrical and Control Engineering National Chiao Tung University, Hsinchu, Taiwan, R.O.C.; Copyright 2008 IEEE; pp. 1930-1933.

Jackson, et al., "An L-Band CMOS Frequency Doubler using a Time-Delay Technique", Department of Electrical and Computer Engineering Queen's University, Kingston, Ontario, Canada, K7L 3N6; Copyrigt 2006 IEEE; pp. 131-134.

\* cited by examiner

*Primary Examiner* — Phuong Phu

(74) *Attorney, Agent, or Firm* — Cantor Colburn LLP; David Cain

(57) ABSTRACT

A clock-data recovery doubler circuit for digitally encoded communications signals is provided. A window comparator includes two thresholds. A clock output is created by the window comparator and also used internally as feedback. Based on the clock output, the window comparator circuit collapses the thresholds while sampling input Bipolar return to zero data.

21 Claims, 12 Drawing Sheets

STRUCTURE FOR WINDOW COMPARATOR CIRCUIT FOR CLOCK DATA RECOVERY FROM BIPOLAR RZ DATA

BACKGROUND

Exemplary embodiments relate to a design structure, and more specifically, a design structure of circuit for clock recovery from Bipolar RZ data.

Return-to-zero (RZ) describes a line code used in telecommunications signals in which the signal drops (returns) to zero between each pulse. This takes place even if a number of consecutive 0's or 1's occur in the signal. The signal is self-clocking. This means that a separate clock does not need to be sent alongside the signal, but may use twice the bandwidth to achieve the same data-rate as compared to non-return-to-zero format. The "zero" between each bit is a neutral or rest condition.

A non-return-to-zero (NRZ) line code is a binary code in which 1's are represented by one significant condition (usually a positive voltage) and 0's are represented by some other significant condition (usually a negative voltage), with no other neutral or rest condition. The pulses have more energy than a RZ code. Unlike RZ, NRZ does not have a rest state. NRZ is not inherently a self-synchronizing code, so some additional synchronization technique (for example a run length limited constraint or a parallel synchronization signal) must be used to avoid bit slip.

BRIEF SUMMARY

According to exemplary embodiments, a circuit, method, and design structure are provided for a clock-data recovery doubler circuit for digitally encoded communications signals. A first level shifter has an output coupled to a first inverter and an input coupled to a second inverter. A second level shifter has an input coupled to a third inverter and an output coupled to a fourth inverter. A first multiplexer circuit has inputs coupled to outputs of the first and second inverters. A second multiplexer circuit has inputs coupled to outputs of the third and fourth inverters. A NAND logic gate has a first input coupled to an output of the first multiplexer circuit and a second input coupled to an output of the second multiplexer circuit. A fifth inverter has an input coupled to an output of the NAND logic gate and an output coupled to a plurality of transmission gates comprising the first and second multiplexer circuits. The output of the NAND logic gate is also coupled to an opposing side of the plurality of transmission gates comprising the first and second multiplexers.

According to exemplary embodiments, a clock-data recovery doubler circuit for digitally encoded communications signals is provided. A window comparator includes two thresholds. A clock output is received by the window comparator as feedback. Based on the clock output, the window comparator circuit collapses the thresholds while sampling input Bipolar return to zero data.

Additional features are realized through the techniques of the present disclosure. Other systems, methods, apparatus, and/or computer program products according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features of the present disclosure are apparent from the following detailed description taken in conjunction with the accompanying drawings in which:

DETAILED DESCRIPTION

Exemplary embodiments are configured to provide a circuit for extracting the clock from Bipolar RZ data.

In the state of the art, a system may use clock data recovery (CDR) circuit (or in other words Delay Locked Loop) and phase-locked loop or phase lock loop (PLL) circuits to recover clock from the received data. The PLL is a big, complex, and noise-sensitive circuit, and the placement of the PLL also is an issue because of the noise-sensitivity. Consequently, routing of the high-speed clock from PLL to the receiver also has to be done carefully.

In the state of the art, for the CDR circuit to align the PLL's clock reliably with the incoming data, the data needs to have frequent transitions. This is because the CDR circuit uses data edges to keep the clock aligned to get maximum eye-opening. To fulfill this requirement, the transmitter has to encode the data using some Mb/Nb encoding (e.g. 64 b/66 b encoding), and consequently, the receiver has to have Nb/Mb decoding. Also, because the Mb/Nb encoded data has to be sent on one lane, it has to be serialized, which requires a serializer at the transmitter and deserializer at the receiver. If the Mb/Nb encoded data were sent over different lanes, the whole purpose of encoding is defeated because when encoded data is sent over multiple lanes in parallel, encoding cannot guaranty frequent transitions. Apart from adding the extra circuitry at both the transmitter and receiver, the issue of the above two points is that, the encoder, serializer, deserializer and decoder add latency. In many applications, such as memory protocols, latency is an equally important factor as the bandwidth. Thus, use of a CDR based receiver for such applications though improves bandwidth, affects the latency significantly. Also, it takes significant time for the CDR circuit to lock on to the data from a no lock condition, and because of this, if there is no real data for transmission, the transmitter has to send idle-data (which has no content but keeps creating frequent transitions) in order to keep the CDR locked. This expends considerable power due to switching. Otherwise, if the transmission is stopped in such cases, to be able to send and receive data reliably again when data is available for transmission, a training sequence has to be sent for the receiver's CDR to get its lock back. This takes considerable time and thus creates considerable latency as well as overall bandwidth reduction. Furthermore, the CDR circuit has a constraint in that it can track long term or slow jitter well but cannot cope with high cycle-to-cycle jitter present in the incoming data. As a result of this, when such cycle-to-cycle jitter comes in the data waveform, the sampling of the subsequent bits is drifted until the CDR gets the lock back.

Exemplary embodiments provide a technique (e.g., a circuit) for improving the noise margin which can create the clock signal from the received data that was transmitted using an encoding technique.

Figure 1:
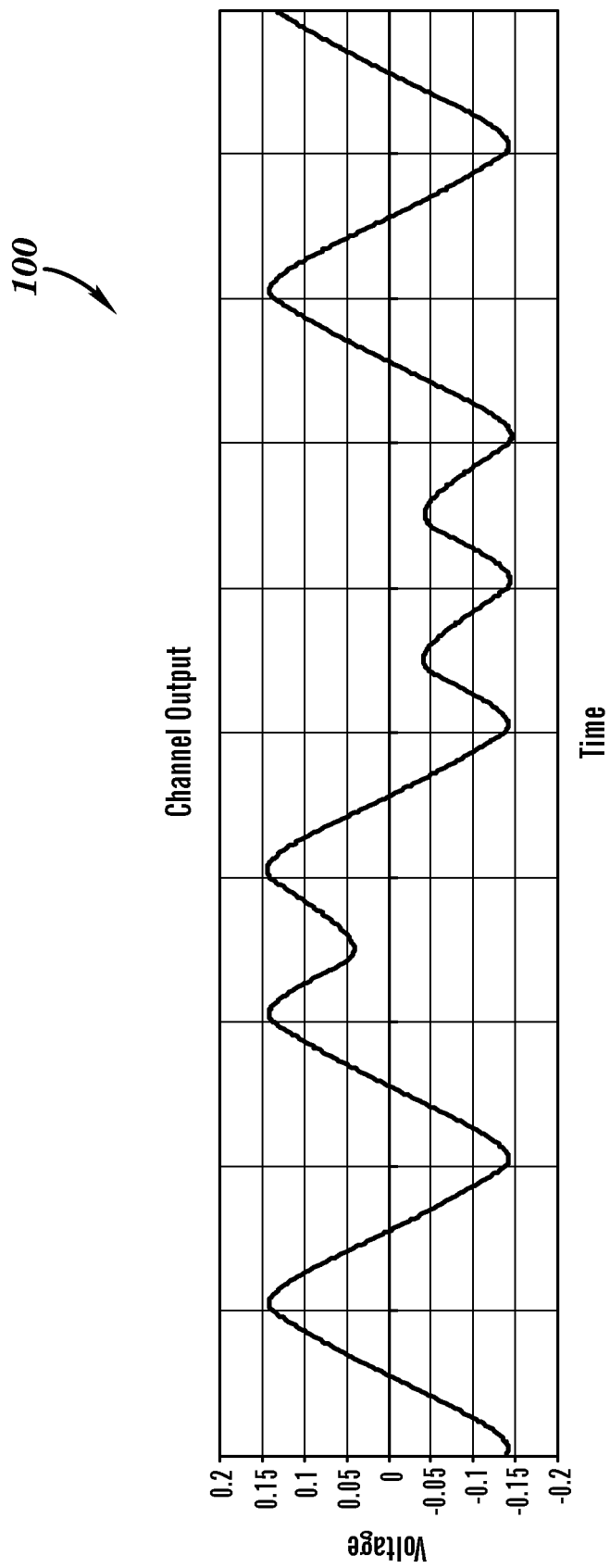
FIG. 1 illustrates a graph in accordance with exemplary embodiments.

FIG. 1 is a graph 100 that illustrates an example of the received data when transmitted with encoding technique according to an embodiment. This data is received by the doubler circuit discussed below. The data in graph 100 is one example of Bipolar RZ data which is not meant to be limiting.

Figure 2:
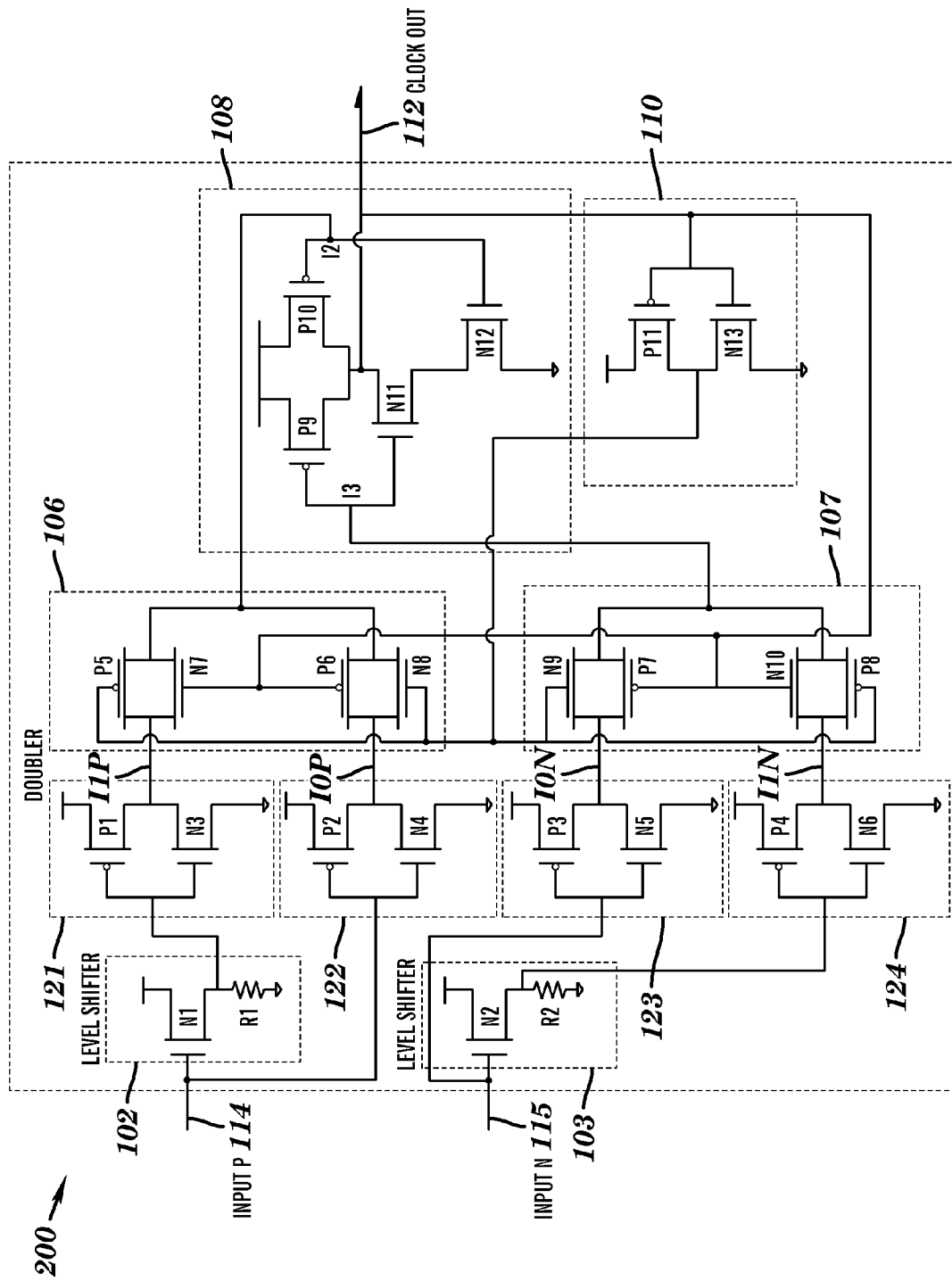
FIG. 2 illustrates a circuit in accordance with exemplary embodiments.

FIG. 2 illustrates a doubler circuit 200 in accordance with exemplary embodiments.

The doubler circuit 200 comprises two N-MOS level shifters 102 and 103 followed by first inverter 121, second inverter 122, third inverter 123, and fourth inverter 124 and followed by two (analog) multiplexers 106 and 107 followed by a NAND logic gate 108.

The first level shifter 102 comprises a negative channel (n-channel) metal oxide semiconductor (N-MOS) field effect transistor (FET) transistor N1 with the drain coupled to VDD (e.g., 1 volt) and its source coupled to ground through a resistor R1. Note that VDD is represented as a horizontal line and ground is represented as a down pointing triangle as understood by one skilled in the art. The input P (INP) at the gate of the first level shifter is input P 114.

Similarly, the second level shifter 103 comprises a n-channel metal oxide semiconductor (N-MOS) field effect transistor (FET) transistor N2 with the drain coupled to VDD (e.g., 1 volt) and its source coupled to ground through a resistor R2. The input N (INN) at the gate of the second level shifter is input P 115. The inputs 114 and 115 are differential inputs, so as data entering one input increases the data entering other input decreases.

The first inverter 121 comprises a positive channel (p-channel) metal oxide semiconductor (P-MOS) field effect transistor (FET) transistor P1 and transistor N3, which are coupled at their gates (i.e., inputs) to the output of the first level shifter 102. The source of P1 is coupled to VDD and its drain is coupled to the drain of N3. The source of N3 is coupled to ground. The second inverter 122 comprises transistors P2 and N4, which are coupled at their gates (i.e., inputs) to the input P 114. The source of P2 is coupled to VDD and the drain of P2 is coupled to the drain of N4. The source of N4 is coupled to ground.

The third inverter 123 comprises transistors P3 and N5, which are coupled at their gates (i.e., inputs) to the input 115 N. The source of P3 is coupled to VDD and the drain of P3 is coupled to the drain of N5. The source of N5 is coupled to ground. Also, fourth inverter 124 comprises transistors P4 and N6, which are coupled at their gates (i.e., inputs) to the output of the second level shifter 103. The source of P4 is coupled to VDD and the drain of P4 is coupled to the drain of N6. The source of N6 is coupled ground.

The first multiplexer 106 receives inputs I1P and I0P which are corresponding outputs I1P and I0P from the first and second inverters 121 and 122, respectively. The first multiplexer 106 comprises transistors P5 and N7, and as one input to the first multiplexer 106, the sources of P5 and N7 are coupled to output I1P of the first inverter 121. The drains of P5 and N7 are coupled to input I2 of the NAND logic gate 108. As another input to the first multiplexer 106, transistors P6 and N8 are coupled at their sources to output I0 of the second inverter 122. The drains of P6 and N8 are coupled to input I2 of the NAND logic gate 108.

Similarly, the second multiplexer 107 receives inputs I1N and I0N which are corresponding outputs I1N and I0N from the fourth and third inverters 124 and 123. The second multiplexer 107 comprises transistors N9 and P7, and as one input to the second multiplexer 107, the sources of N9 and P7 are coupled to the output I0N of the third inverter 123. The drains of N9 and P7 are coupled to an input I3 of the NAND logic gate 108. As another input to the second multiplexer 107, transistors N10 and P8 are coupled at their sources to output I1N of the fourth inverter 124. The drains of N10 and P8 are coupled to input I3 of the NAND logic gate 108.

A fifth inverter 110 comprises transistor P11 with its source coupled to VDD and its drain coupled to the drain of transistor N13. The source of N13 is coupled to ground. The output of the fifth inverter 110 is coupled to the gates of P5 and N8 of the first multiplexer 106 and the gates of N9 and P8 of the second multiplexer 107.

The output clock out 112 of the NAND logic gate 108 is coupled to the gates of N7 and P6 of the first multiplexer 106, the gates of P7 and N10 of the second multiplexer 107, and the gates of P11 and N13 of the fifth inverter 110. In the NAND logic gate 108, transistors P9 and P10 are coupled at their sources to VDD. The drains of P9 and P10 are coupled to the clock output 112 and are coupled to the drain of transistor N11. The source of N11 is coupled to the drain of transistor N12. The source of N12 is coupled to ground. The gates of P9 and N11 are coupled to the input I3 which is the output of the second multiplexer 107. The gates of P10 and N12 are coupled to the input I2 which is the output of the first multiplexer 106.

The doubler circuit 200 is a window-comparator with dynamic thresholds. The doubler circuit 200 is called a doubler because it can also act as frequency doubler, i.e., if the doubler circuit 200 is fed with an input differential-clock at inputs 114 and 115, the clock output 112 of the doubler circuit 200 has double the frequency than that of the input clock. The output of the double circuit 200 is the clock output 112 shown in FIG. 2.

In accordance with exemplary embodiments, the doubler circuit 200 is configured to recover the clock from Bipolar RZ data input in input P 114 and input N 115 where the noise margin of the doubler circuit 200 is equal to that of CDR plus (+) PLL based system. In state of the art, if a window-comparator circuit which employs fixed thresholds is used to recover clock from the Bipolar RZ data, the noise margin of the state of the art circuit is drastically reduced compared to the CDR+PLL based system. This is because there is very less noise margin left after deducting the two thresholds from the data signal. However, in exemplary embodiments, the process of changing the thresholds of the window in FIG. 8 while recovering the clock from the Bipolar RZ data improves the noise margin of the doubler circuit 200 to that equal to a CDR+PLL based system, without requiring a CDR circuit and/or PLL circuit.

Figure 6:
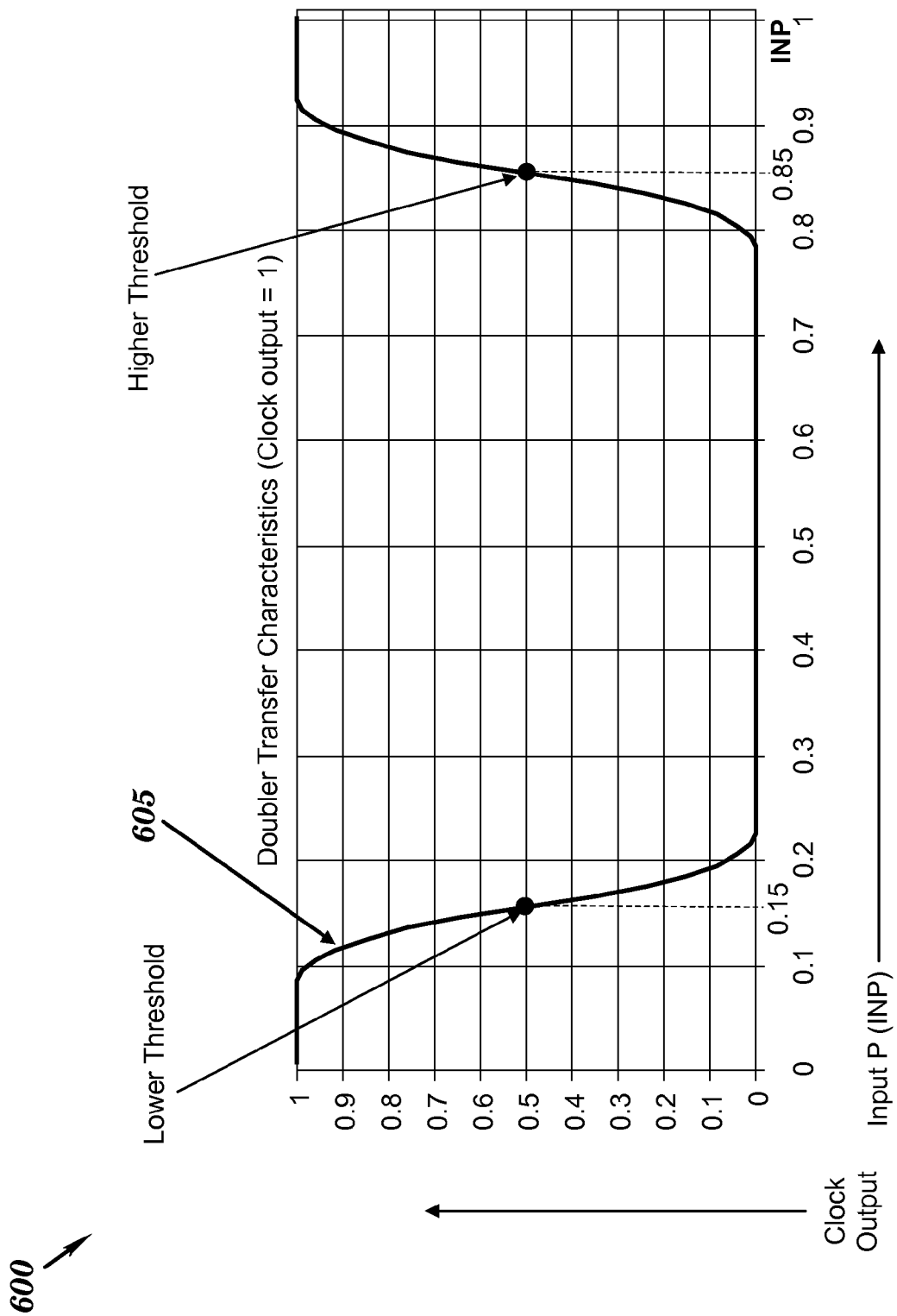
FIG. 6 illustrates a graph in accordance with exemplary embodiments.
Figure 7:
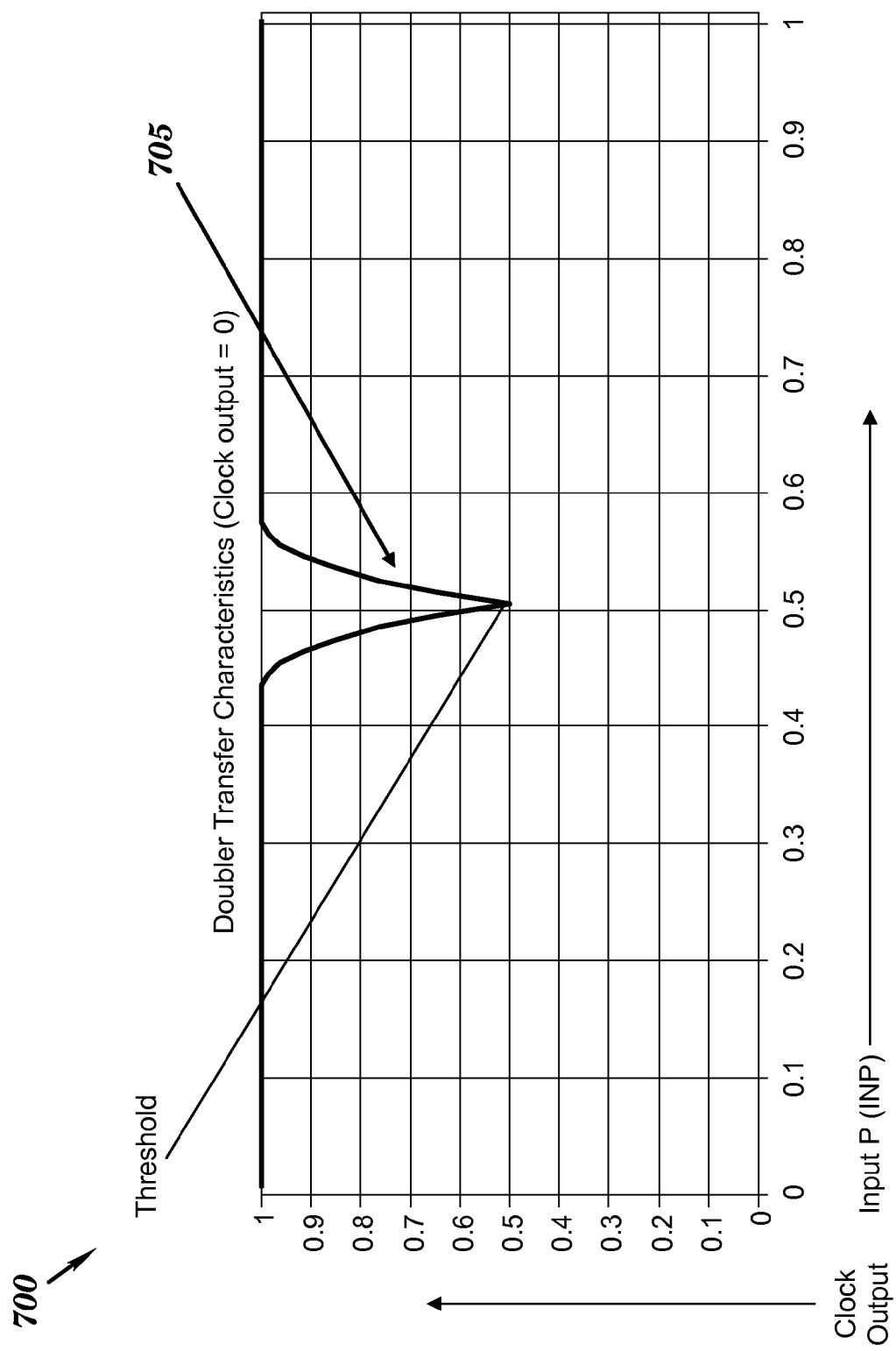
FIG. 7 illustrates a graph in accordance with exemplary embodiments.
Figure 8:
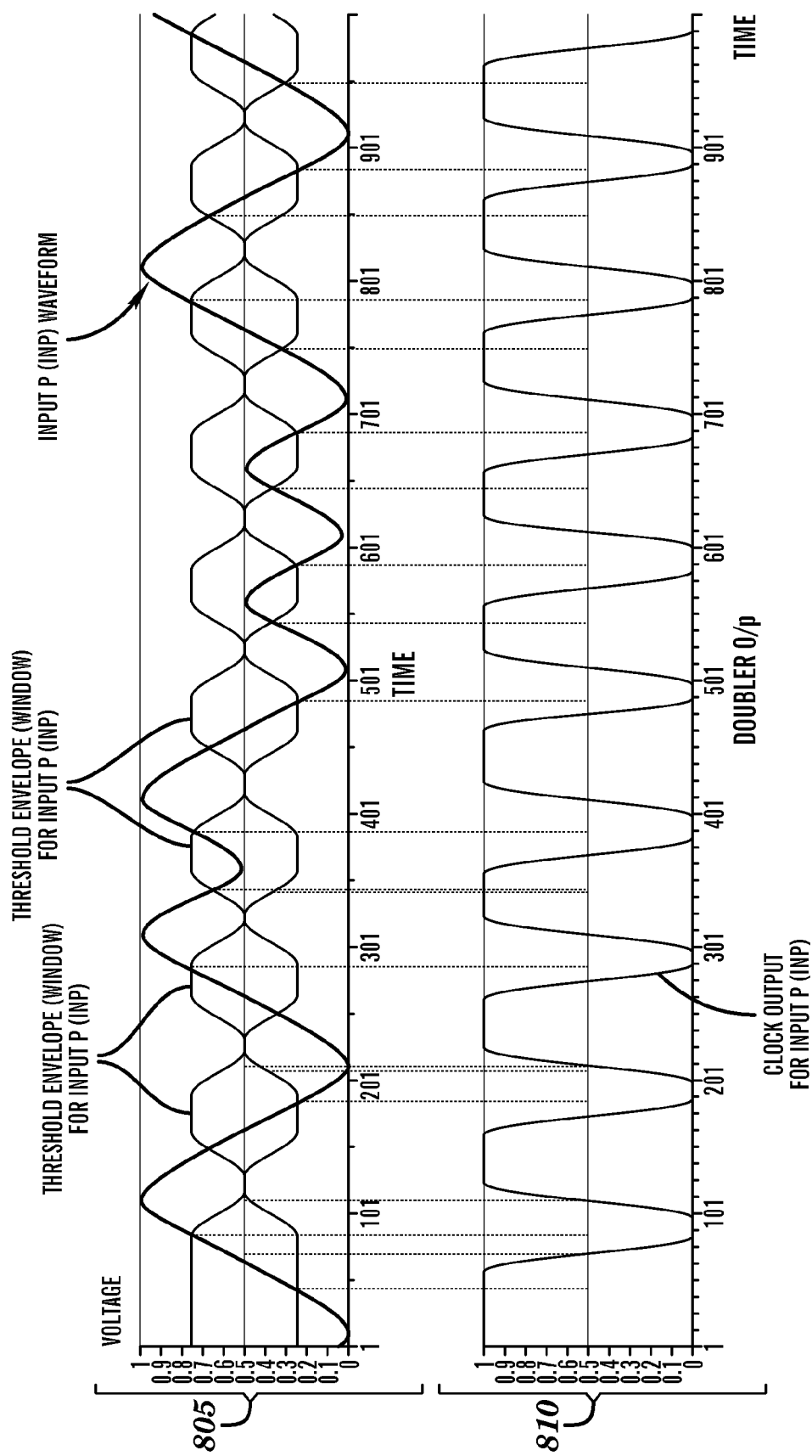
FIG. 8 illustrates a graph in accordance with exemplary embodiments.

The changing (or collapsing) of threshold (threshold windows or envelopes) happens because of the feedback which is given to the two multiplexers 106 and 107 from clock out 112 (directly and through inverter 110). When clock out 112 is high (logic 1), the I1P and I1N inputs of the two multiplexers 106 and 107 respectively are selected, and when clock out 112 is low (logic 0), the I0P and I0N inputs of the two multiplexers 106 and 107 respectively are selected. When the I1P and I1N inputs of the multiplexers 106 and 107 are selected (i.e., when clock out 112 is high), the input-output characteristics of the whole doubler circuit 200 become as shown in FIG. 6, and the two thresholds shown in FIG. 6 exist. On the other hand when I0P and I0N inputs of the multiplexers 106 and 107 are selected (i.e., when clock out 112 is low), the input-output characteristics of the whole doubler circuit 200 become as shown in FIG. 7 and the two thresholds shown in FIG. 6 cease to exist. Thus, the doubler circuit 200 has the effect of dynamically collapsing the two thresholds based on the clock out 112. The sampling happens at the positive-edge (or from low to high transition) of the clock out 112. For example, as can be seen in FIG. 8, when clock is transitioning from low to high, the threshold envelope is collapsed giving the complete (Input-Swing)/2 volts of noise-margin at both 0 and 1 levels of input P 114. Thus, the noise margin is equal to that of a CDR plus (+) PLL based receiver circuit.

Use of the doubler circuit 200 for recovery of clock signal which has dynamic thresholds instead of fixed ones provides benefits over the above mentioned system that uses CDR and/or PLL circuits. For example, the benefits (which are not necessarily required) of using the doubler circuit 200 to recover clock in a receiver are as follows:

1. By employing the doubler circuit 200, the receiver does not require CDR circuit and/or PLL circuit.

2. Since the doubler circuit 200 utilizes the self-clocking nature of the received data to spontaneously create clock, there is no need for data to have frequent 1 to 0 or 0 to 1 transitions. Consequently, there is no need for any Mb/Nb encoding at the transmitter and no Nb/Mb decoding at the receiver. Note that the doubler circuit 200 may be included in the receiver and/or coupled to the receiver. In telecommunications, Mb/Nb are line codes that map M-bit symbols to N-bit symbols (e.g. 8 b/10 b Encoding or 64 b/66 b encoding) to achieve DC-balance and bounded disparity, and yet provide enough state changes to allow reasonable clock recovery. This means that there are just as many 1s as 0s in a string of two symbols, and that there are not too many 1s or 0s in a row. This is an important attribute in a signal that needs to be sent at high rates because it helps reduce inter-symbol interference.

3. Since there is no need for any Mb/Nb encoding, there is also no need to serialize the data, which means use of the doubler circuit 200 requires no serializer at the transmitter as well as no de-serializer at the receiver.

4. Since both Mb/Nb encoding-decoding and serialization-deserialization are eliminated, there is no additional latency, while the doubler circuit 200 still has (nearly) the same bandwidth as a CDR+PLL circuit. In one implementation, the bandwidth is actually a little higher and in the case of elimination of 8 b/10 b encoding the bandwidth gain is 20%. This is because in 8 B/10 B encoding for each 8 bits, 10 bits are sent over the signal lines and hence there is 20% loss of bandwidth (10−8)/10×100. In exemplary embodiments, this loss is completely eliminated which may be considered significant. In the case of elimination of 64 B/66 B encoding, the bandwidth gain is (66−64)/66×100=3.03%. The bandwidth gain in this case might be smaller but the latency in the case of 64 B/66 B encoding/decoding is 4 times that of 8 B/10 B encoding/decoding, which is completely eliminated and is a significant gain over latency according to exemplary embodiments. This can be very useful and a deciding factor in adopting the receiver circuit for applications like memory protocols.

5. The clock generation with the doubler circuit 200 is (nearly) instantaneous, and hence there is no need for sending idle-data (in order to create transitions) when there is no real data for transmission. This allows transmission to be paused for the time when there is no data available for transmission which would save considerable amount of power for the transmitter transmitting the data and the receiver. Also, because of (nearly) instantaneous clock generation capability of the doubler circuit 200, the transmission can resume very quickly from idle without the transmitter being required to send training sequence. This would remove a lot of latency, improve overall bandwidth, and save power unlike a CDR based receiver.

6. Unlike CDR based systems, since the clock recovery in the doubler circuit 200 is instantaneous, the doubler circuit 200 is effective in handling (processing) higher cycle-to-cycle jitter present in the incoming data from the transmitter. Sudden incoming jitter has no effect on sampling of subsequent bits with the doubler circuit 200.

Figure 3:
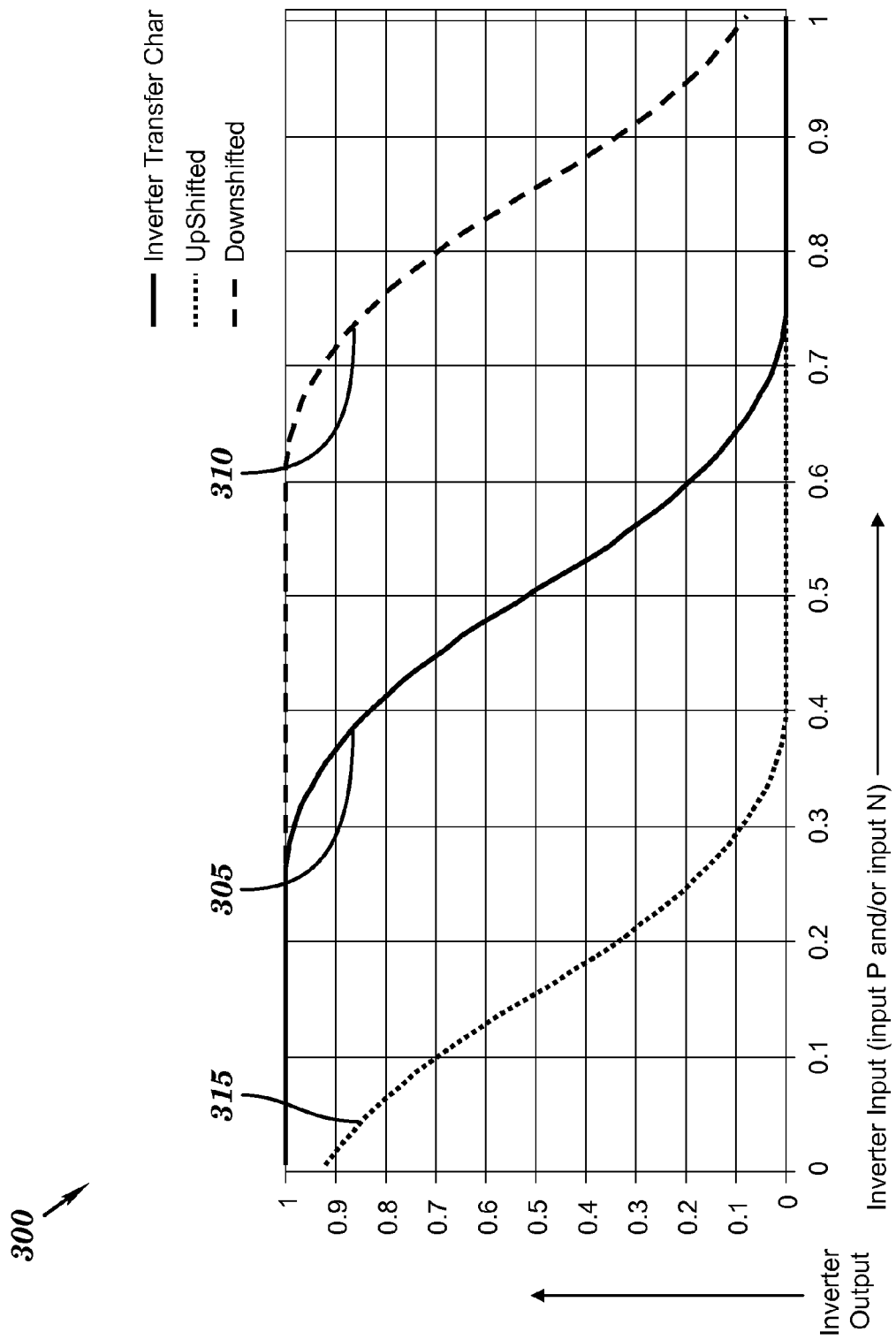
FIG. 3 illustrates a graph in accordance with exemplary embodiments.

FIG. 3 illustrates a graph 300 in accordance with exemplary embodiments. A center waveform 305 is the transfer characteristic for transistors P2 and N4 and also for transistors P3 and N5, both of which do not have their inputs coupled to the level shifters 102 and 103, respectively.

As a result of the first level shifter 102 which subtracts a constant voltage Vt from the input P 114, the transfer characteristic of the transistors P1 and N3 is down-shifted and shown as waveform 310. Likewise, as a result of the second level shifter 103 which subtracts a constant voltage Vt from the input N 115, the transfer character of the transistors P4 and N6 is also represented by waveform 310. Waveform 315 shows an example if the level shifters 102 and 103 were P-MOS transistors FIG. 4 illustrates a graph 400 in accordance with exemplary embodiments.

From the inputs I1 (which are inputs I1P and I1N) into the multiplexers 106 and 107, the corresponding output signals are shown as waveform 405 (from the first inverter 121) and 410 (from the fourth inverter 124), respectively.

Figure 4:
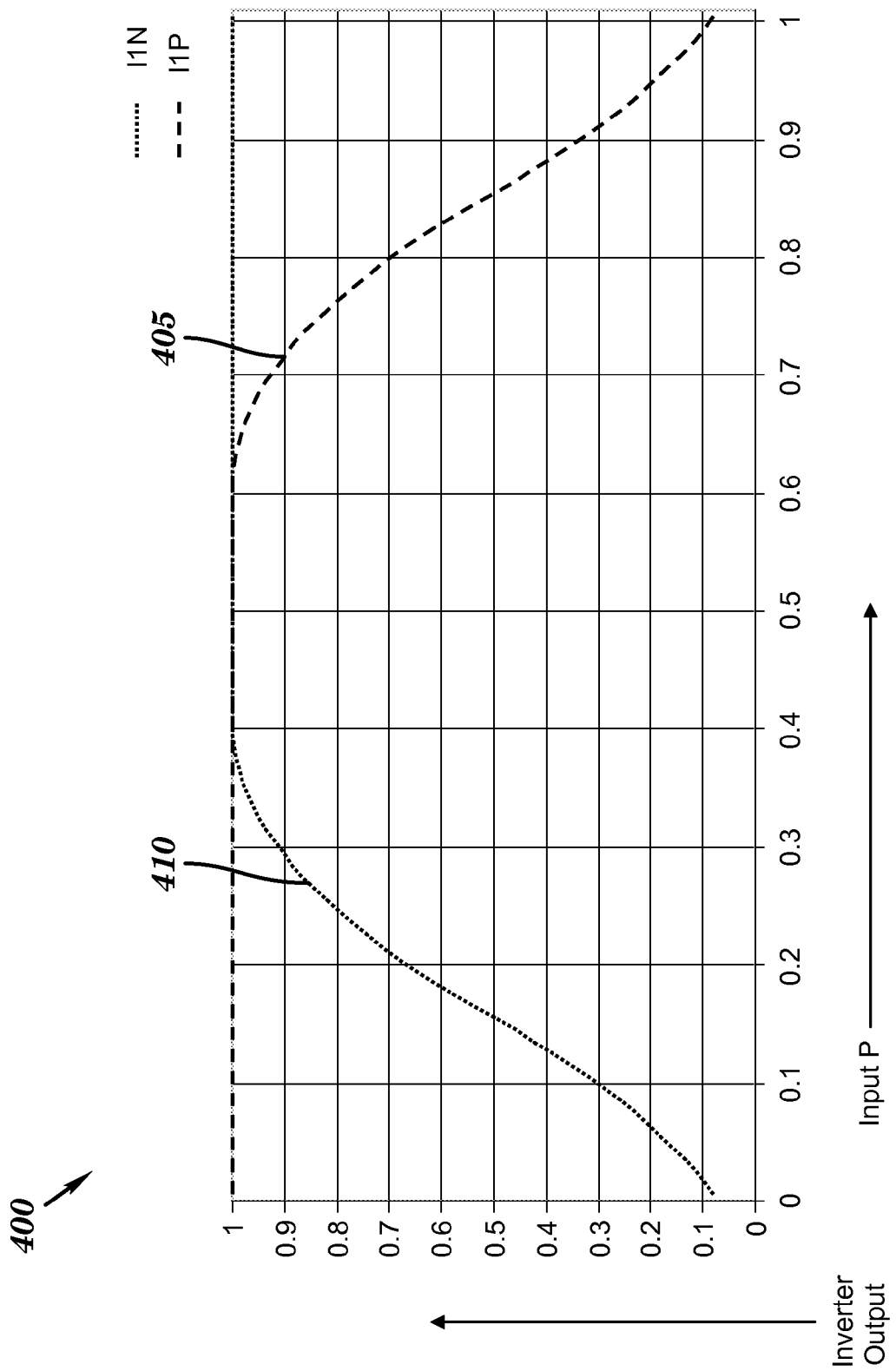
FIG. 4 illustrates a graph in accordance with exemplary embodiments.
Figure 5:
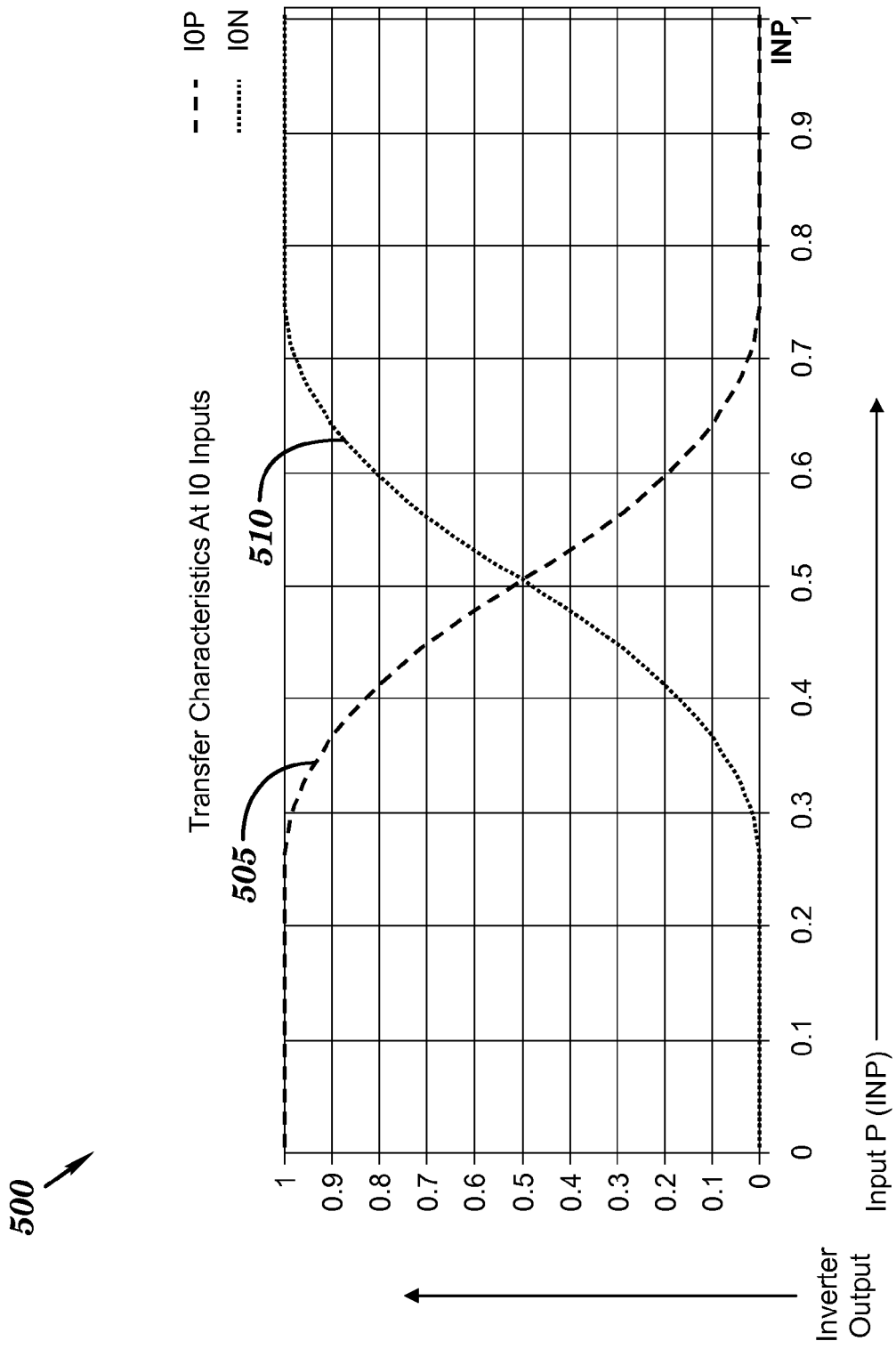
FIG. 5 illustrates a graph in accordance with exemplary embodiments.

Note that the x-axis in FIG. 4 only shows the input P 114 of the doubler circuit 200, which is why the waveform 410 is of opposite polarity as compared to a normal inverter waveform 305 in FIG. 3. There are two more signals coming to the inputs I0 (which are inputs I0P and I0N) of the multiplexers 106 and 107 which are without the level shifters 102 and 103, and the transfer characteristics at these inputs I0P and I0N are shown in graph 500 in FIG. 5 with respect to data received at input P 114 of the doubler circuit 200. Waveform 505 shows the transfer characteristic of the output I0P from the second inverter 122 for data received at input P 114. Waveform 510 shows the transfer characteristic of the output I0N from the third inverter 123 for data received at input P 114.

As can be seen in FIG. 2, there is a clock output 112 feedback from the NAND logical gate 108 to the select input for multiplexers 106 and 107, and because of this feedback, when output of the NAND logic gate 108 is equal to 1 (i.e., a logic 1), the multiplexers 106 and 107 select input I1P and I1N respectively. Conversely, when the NAND logic gate 108 clock output is 0, the multiplexers 106 and 107 select input I0P and I0N respectively. As a result of this architecture in the doubler circuit 200, when the NAND logic gate 108 clock output is 1, the input-output transfer characteristics of the complete doubler circuit 200 are as shown in FIG. 6. In graph 600, FIG. 6 illustrates a waveform 605 of the transfer characteristics for input P (INP) 114 when both inputs I1P and I1N are selected at the multiplexers 106 and 107 because the clock output 112 is a logic 1. The input-output characteristics for input N (INN) 115 have the same characteristics.

When the NAND logic gate 108 clock output 112 is 0 (i.e., logic 0), the transfer characteristics of the doubler circuit 200 are as shown in a waveform 705 in graph 700 of FIG. 7. In the graph 700, FIG. 7 illustrates the clock output 112 of the NAND logic gate 108 on the y-axis versus the input P 114 (INP) on the x-axis. In FIG. 7, both inputs I0P and I0N are selected at the multiplexers 106 and 107 by having a logic 0 at the clock output 112.

Referring to FIG. 6, the clock output 112 of the doubler circuit 200 becomes a logic 0 when the input P 114 of the doubler circuit 200 is above the lower threshold (approximately 0.15) and below the higher threshold (approximately 0.85). The clock output 112 of the doubler circuit 200 is a logic 1 otherwise, such as below the lower threshold (e.g., 0.15) and higher than the higher threshold (e.g., 0.85).

Further, if the Bipolar RZ data received at input P 114 is like that shown in graph 805 in FIG. 8, then the clock output 112 of the doubler circuit 200 is as shown by graph 810 in FIG. 8.

In FIG. 8, the clock output 112 collapses the thresholds of a window comparator at the time of sampling the Bipolar RZ data while recovering clock from the same Bipolar RZ data. The Bipolar RZ data is received at input P 114 (INP) and input N 115 (INN). The Bipolar return to zero (RZ) data received at the inputs 114 and 115 are differential, such that one input (e.g., input P 114) receives the signal and the other input (e.g., input N 115) receives its complement. For example, for the Bipolar RZ data received at input P 114 and input N 115, input N=1−input P.

The clock output 112 of the doubler circuit 200 can be utilized as clock to sample the input P 114 data received by the doubler circuit 200, which samples/retrieves the data of input P 114 sent by the transmitter.

The doubler circuit 200 is configured to change the threshold windows dynamically. FIG. 6 shows 2 thresholds (higher and lower), and FIG. 7 shows no threshold. The input-output characteristics keep changing from FIG. 6 to FIG. 7 and back based on the state of clock out 112. For example, referring to FIG. 8, when the clock output 112 of the doubler circuit 200 is high (e.g., logic 1) then that means the data (input P data) has just been sampled and a transition in the data (input P data) is expected. Hence, the threshold window should be opened to capture the transition of the data (input P data). On the other hand, when the clock output 112 of the doubler circuit 200 is low (e.g., logic 0) then that means the data (input P data) has just made a transition and hence a stable value to be sampled is expected. Accordingly, the doubler circuit 200 closes the window to capture the stable value of the data. Sampling occurs during the closed window.

For ease of understanding, section heading are provided below and are not meant to be limiting.

Noise Margin at the Receiver:

As can be seen from FIG. 8, the noise margin of the doubler circuit 200 is almost equal to half of the full swing which is equal to that of a serial receiver that uses a PLL+CDR circuit to sample its incoming data. This is because the threshold envelope of the doubler circuit 200 folds itself to VDD/2 at the time of sampling, so when the incoming signal (e.g., input P 114) is sampled the doubler circuit 200 has half of the total swing as margin for the noise. Also, when the input signal is inside threshold envelope, i.e., while making the transitions, the noise margin (of the doubler circuit 200) is also almost equal to the half of the full swing. This makes the doubler circuit 200 as immune to the noise as the PLL based receiver circuit.

Jitter Tolerance at the Receiver:

Because all the events mentioned above in the receiver description happen on the fly unlike a PLL based receiver, the jitter tolerance of the doubler circuit 200 is much higher. Because a PLL circuit acts like a low pass filter to the frequency, the PLL circuit cannot act quickly to the varying data pulse widths/edges and hence cannot always sample the data (e.g., input P 114) at its peak. Because of this, jitter tolerance of the PLL is usually a complex design issue. On the other hand, because the doubler receiver circuit 200 described herein will sample the signal always when the signal is out of the threshold envelop due to its inherent structure, the doubler circuit 200 has much higher jitter tolerance. Also, because of the same fact, a PLL+CDR based receiver cannot guaranty the sampling at the optimum eye-opening after a sudden jitter has passed through, while in the case of the doubler circuit 200 based receiver, such a case of sudden jitter has (virtually) no effect on sampling of subsequent bits.

Maximum Frequency Limit:

As can be seen in FIG. 2, the minimum bit length/time period $T_{min}$ that the doubler circuit 200 receiver can handle is:

$$T_{min}=T_w+Tp_{NAND}+Tp_{MUX}$$

where $T_w$ is the time the signal spends inside the threshold envelope, where $Tp_{NAND}$ is the propagation delay of the NAND gate 108, and where $Tp_{MUX}$ is the propagation delay of the multiplexers 106 or 107 (whichever is higher, not combined).

We know that $T_w$ can be as low as $Tp_{NAND}$, otherwise the doubler circuit 200 output will never go to 0 completely.

Thus, $$T_{min}=Tp_{NAND}+Tp_{NAND}+Tp_{MUX}$$

$$F_{max}=1/T_{min}$$

where $F_{max}$ below is the baud rate or maximum bandwidth in bits/sec.

Figure 9:
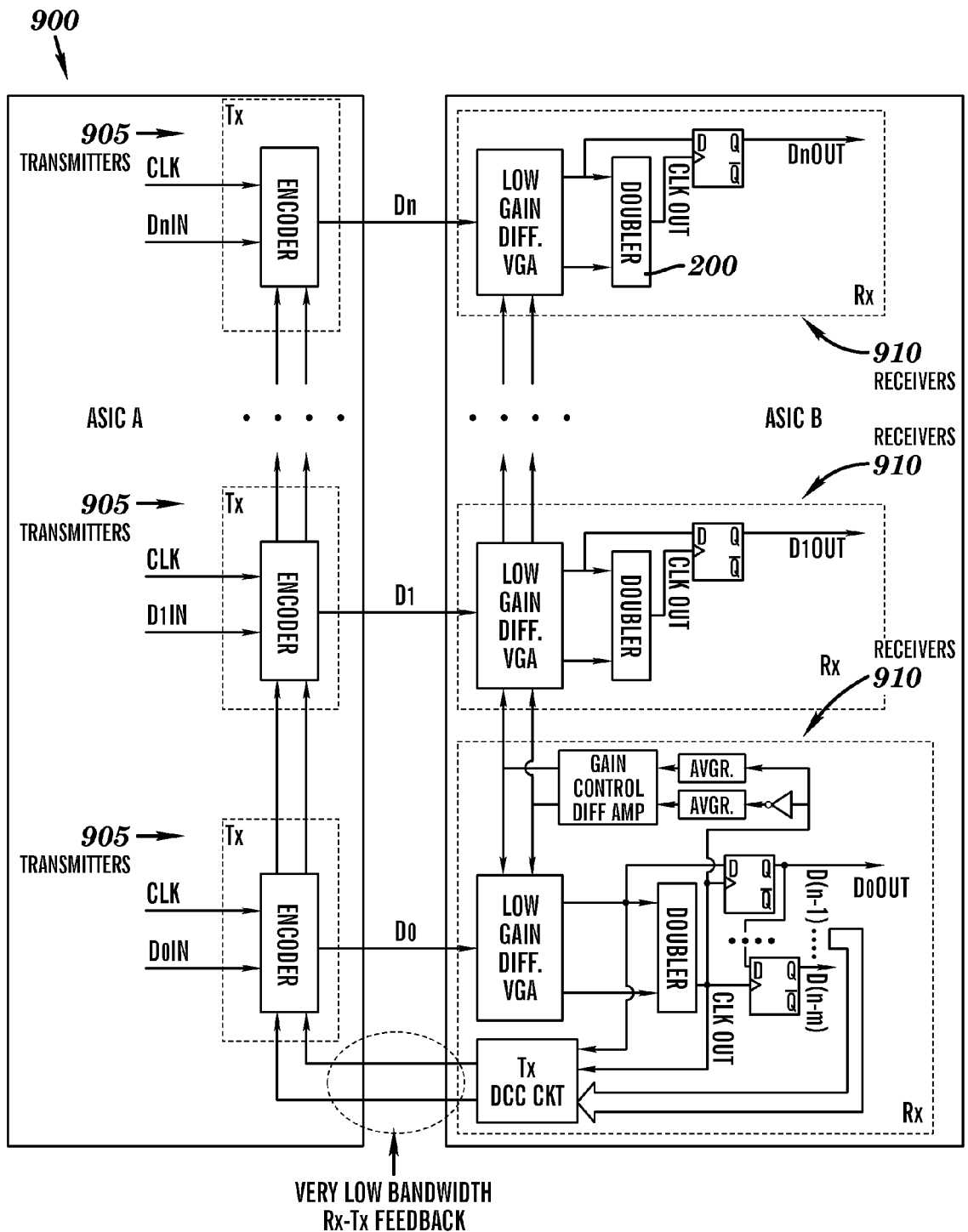
FIG. 9 illustrates an example implementation in accordance with exemplary embodiments.
Figure 10:
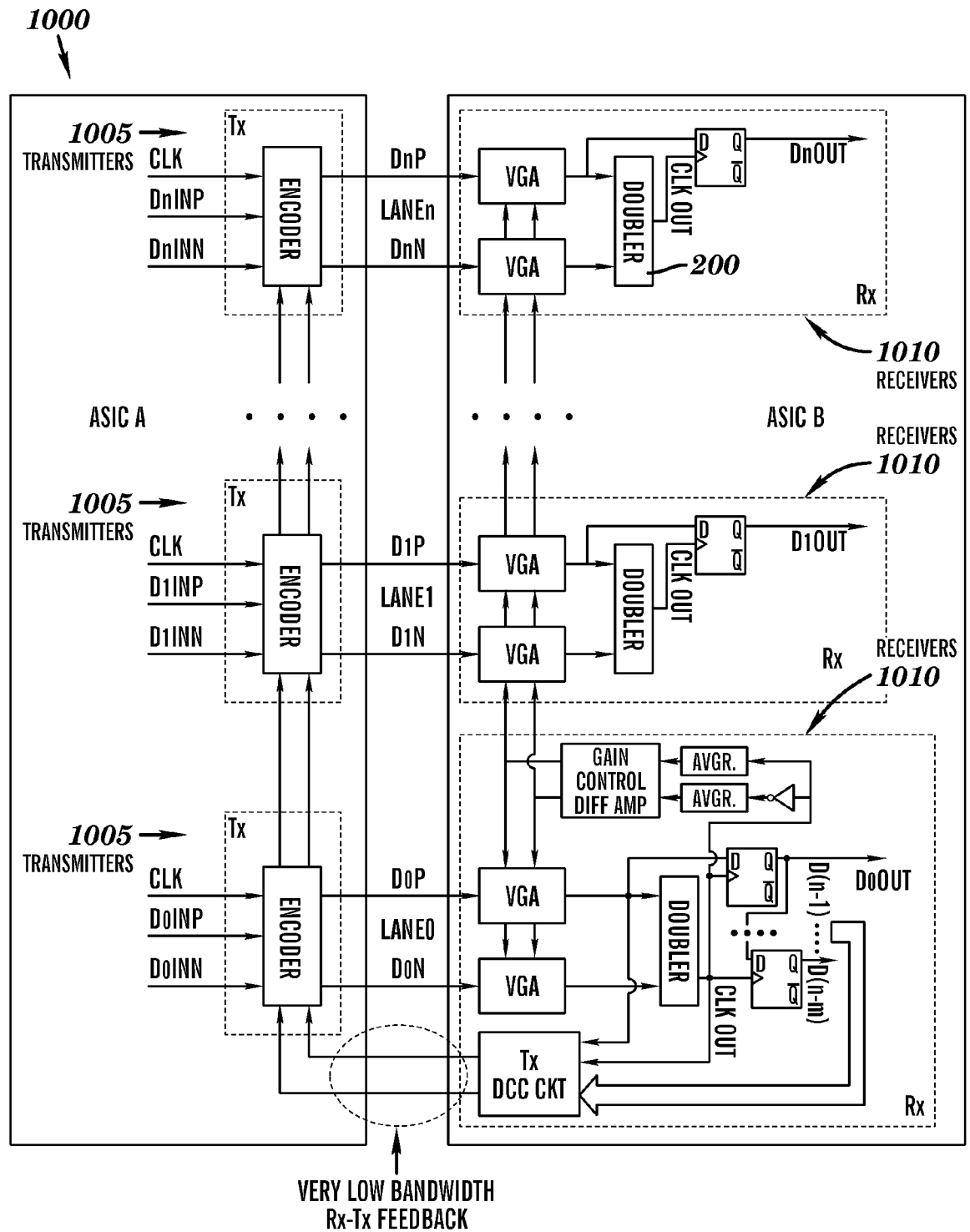
FIG. 10 illustrates an example implementation in accordance with exemplary embodiments.

Now turning to FIGS. 9 and 10, FIGS. 9 and 10 illustrate example systems including the doubler circuit 200 (which is referred to as doubler) according to exemplary embodiments. The systems illustrate high-speed data-communication over multiple data-lanes.

In accordance with exemplary embodiments, FIG. 9 illustrates a single ended communication system 900 in one implementation, and FIG. 10 illustrates a dual ended communication system 1000 in another implementation. In FIG. 9, transmitters 905 transit the single ended (only positive side) signal to the receivers 910. The receivers' internal Low Gain Differential VGA (Variable Gain Amplifier) circuit converts this single-ended input signal to differential output signal to feed to the doubler circuit. One of the receivers 910 provides feedback to the transmitters 915.

In FIG. 10, transmitters 1005 transit the signal (i.e., data to input P 114 and input N 115) to the receivers 1010. One of the receivers 1010 provides feedback to the transmitters 1015. Note that transmitters 905 and 1005 can both transmit signals having Bipolar RZ data for processing by the doubler circuit 200 shown in receivers 910 and 1010 respectively, as discussed herein.

Figure 11:
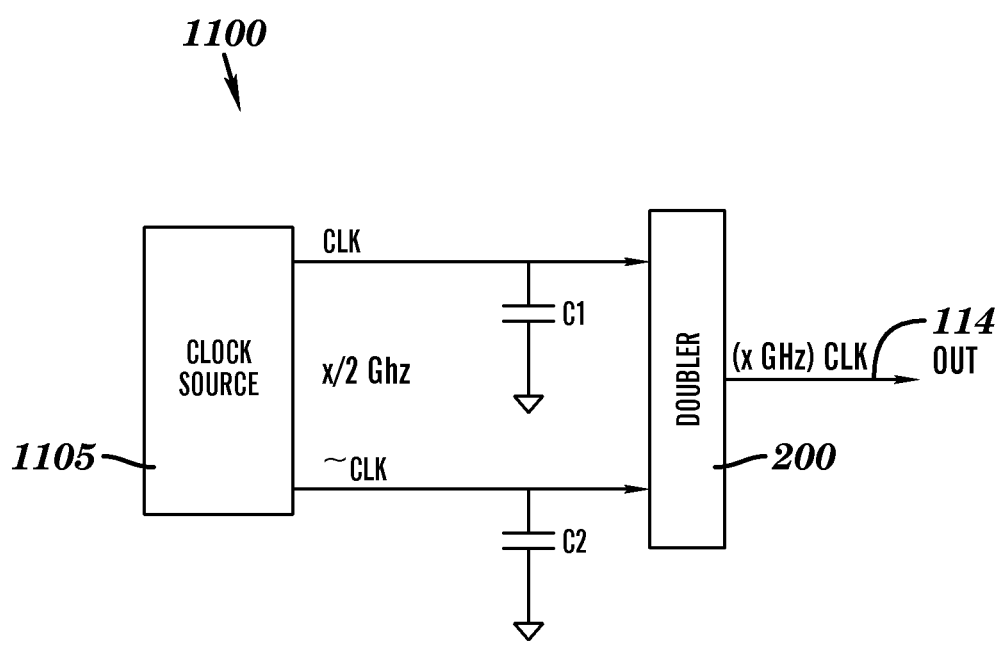
FIG. 11 illustrates an example implementation in accordance with exemplary embodiments.

FIG. 11 illustrates an example implementation for a clock doubling application in accordance with exemplary embodiments, which may be combined with FIGS. 9 and 10.

The capacitors C1 and C2 at the input of the doubler circuit 200 combined with the output impedance of the clock source/driver 1105 act like low pass filters. These low pass filters increase the slew of the square wave clock and thus produce a waveform more like a triangular wave which is then used by doubler circuit 200 to create clock output with twice the frequency of the input signal.

As discussed herein, the doubler circuit 200 is configured to change the thresholds of its window-comparator while recovering clock from a Bipolar RZ data (such as input P 114 and input N 115) which improves the noise-margin of the recovery system having the doubler circuit 200.

The doubler circuit 200 provides the ability to replace CDR and PLL circuits and thus to simplify the receiver circuit considerably for any source-synchronous communication system, which is beneficial. Moreover, removal of encoding, serialization, de-serializing, and decoding circuits (by using the doubler circuit 200 in the receiver) simplifies both the transmitter and receiver significantly. Because of these simplifications to the source-synchronous communication scheme, serial protocols and parallel protocols like processor-memory interfaces can gain from having the doubler circuit 200 to enhance their capabilities.

Figure 12:
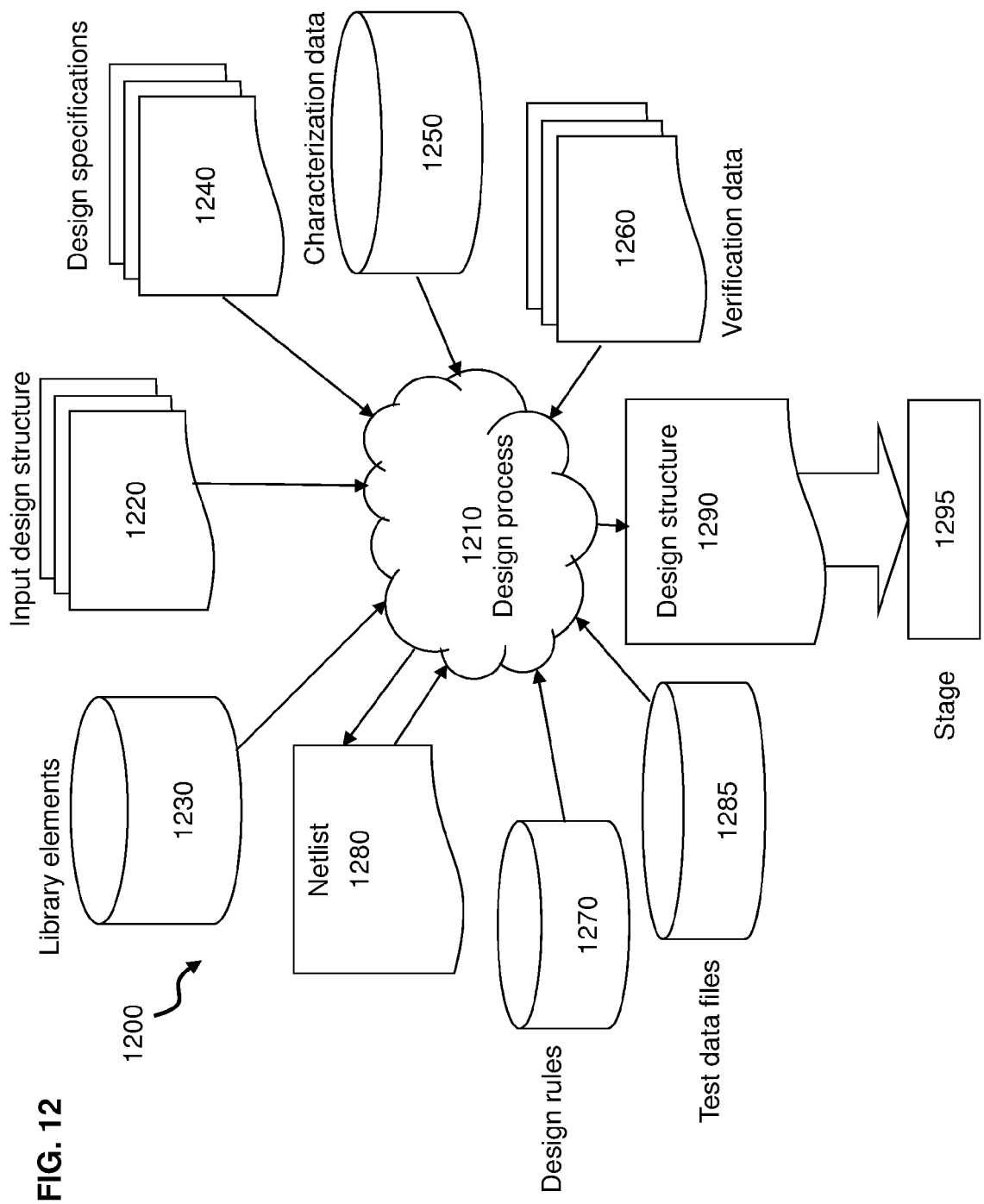
FIG. 12 is a flow diagram of a design process used in semiconductor design, manufacture, and/or test in accordance with exemplary embodiments.

FIG. 12 shows a block diagram of an exemplary design flow 1200 used for example, in semiconductor IC logic design, simulation, test, layout, and manufacture. Design flow 1200 includes processes, machines and/or mechanisms for processing design structures or devices to generate logically or otherwise functionally equivalent representations of the design structures and/or devices described above and shown in FIG. 2. The design structures processed and/or generated by design flow 1200 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1200 may vary depending on the type of representation being designed. For example, a design flow 1200 for building an application specific IC (ASIC) may differ from a design flow 1200 for designing a standard component or from a design flow 1200 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 1220 that is preferably processed by a design process 1210. Design structure 1220 may be a logical simulation design structure generated and processed by design process 1210 to produce a logically equivalent functional representation of a hardware device. Design structure 1220 may also or alternatively comprise data and/or program instructions that when processed by design process 1210, generate a functional representation of the physical structure of a hardware device. Whether representing functional and/or structural design features, design structure 1220 may be generated using electronic computer-aided design (ECAD) such as implemented by a core developer/designer. When encoded on a machine-readable data transmission, gate array, or storage medium, design structure 1220 may be accessed and processed by one or more hardware and/or software modules within design process 1210 to simulate or otherwise functionally represent an electronic component, circuit, electronic or logic module, apparatus, device, or system such as those shown in FIG. 2. As such, design structure 1220 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1210 preferably employs and incorporates hardware and/or software modules for synthesizing, translating, or otherwise processing a design/simulation functional equivalent of the components, circuits, devices, or logic structures shown in FIG. 2 to generate a netlist 1280 which may contain design structures such as design structure 1220. Netlist 1280 may comprise, for example, compiled or otherwise processed data structures representing a list of wires, discrete components, logic gates, control circuits, I/O devices, models, etc. that describes the connections to other elements and circuits in an integrated circuit design. Netlist 1280 may be synthesized using an iterative process in which netlist 1280 is resynthesized one or more times depending on design specifications and parameters for the device. As with other design structure types described herein, netlist 1280 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1210 may include hardware and software modules for processing a variety of input data structure types including netlist 1280. Such data structure types may reside, for example, within library elements 1230 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1240, characterization data 1250, verification data 1260, design rules 1270, and test data files 1285 which may include input test patterns, output test results, and other testing information. Design process 1210 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1210 without deviating from the scope and spirit of the invention. Design process 1210 may also include modules for performing standard circuit design processes such as timing analysis, verification, design rule checking, place and route operations, etc. Design process 1210 employs and incorporates logic and physical design tools such as HDL compilers and simulation model build tools to process design structure 1220 together with some or all of the depicted supporting data structures along with any additional mechanical design or data (if applicable), to generate a second design structure 1290. Design structure 1290 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1220, design structure 1290 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 2. In one embodiment, design structure 1290 may comprise a compiled, executable HDL simulation model that functionally simulates the devices shown in FIG. 2.

Design structure 1290 may also employ a data format used for the exchange of layout data of integrated circuits and/or symbolic data format (e.g. information stored in a GDSII (GDS2), GL1, OASIS, map files, or any other suitable format for storing such design data structures). Design structure 1290 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 2. Design structure 1290 may then proceed to a stage 1295 where, for example, design structure 1290: proceeds to tape-out, is released to manufacturing, is released to a mask house, is sent to another design house, is sent back to the customer, etc.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A hardware clock-data recovery doubler circuit for digitally encoded communications signals, comprising:
    a first level shifter with an output coupled to a first inverter and an input coupled to a second inverter;
    a second level shifter with an input coupled to a third inverter and an output coupled to a fourth inverter;
    a first multiplexer circuit with inputs coupled to outputs of the first and second inverters;
    a second multiplexer circuit with inputs coupled to outputs of the third and fourth inverters;
    a NAND logic gate with a first input coupled to an output of the first multiplexer circuit and a second input coupled to an output of the second multiplexer circuit; and
    a fifth inverter with an input coupled to an output of the NAND logic gate and an output coupled to a plurality of transmission gates comprising the first and second multiplexer circuits;
    wherein the output of the NAND logic gate is also coupled to an opposing side of the plurality of transmission gates comprising the first and second multiplexers.

2. The circuit of claim 1, wherein when bipolar return to zero (RZ) data is received, the NAND logic gate automatically recovers clock from the bipolar RZ data without requiring a clock signal to be received.

3. The circuit of claim 1, wherein the output of the NAND logic gate changes a collapsible window while recovering clock from bipolar RZ data.

4. The circuit of claim 3, wherein changing the collapsible window while recovering the clock causes a noise margin of the circuit to increase.

5. The circuit of claim 1, wherein the output of the NAND logic gate automatically recovers clock for bipolar RZ data received at the inputs of the first and second level shifters and received at inputs of the second and fourth inverters.

6. The circuit of claim 5, wherein when the bipolar RZ data is paused from being received at the inputs of the first and second level shifters and the inputs of the second and fourth inverters, the output of the NAND logic gate automatically recovers the clock when the bipolar RZ data is received again without requiring intervening training data when the bipolar RZ data is paused.

7. The circuit of claim 1, wherein when bipolar RZ data is received, the output of the NAND logic gate collapses a collapsible window at a time of sampling the bipolar RZ data while recovering clock from a same bipolar RZ data.

8. The circuit of claim 1, wherein the output of the NAND logic gate recovers clock without requiring at least one of a clock data recovery (CDR) circuit, a phase-locked loop (PLL) circuit, a serializer circuit, and a deserializer circuit in at least one of a transmitter and receiver.

9. A method for a hardware clock-data recovery doubler circuit for digitally encoded communications signals, comprising:
    providing a first level shifter with an output coupled to a first inverter and an input coupled to a second inverter;
    providing a second level shifter with an input coupled to a third inverter and an output coupled to a fourth inverter;
    providing a first multiplexer circuit with inputs coupled to outputs of the first and second inverters;
    providing a second multiplexer circuit with inputs coupled to outputs of the third and fourth inverters;
    providing a NAND logic gate with a first input coupled to an output of the first multiplexer circuit and a second input coupled to an output of the second multiplexer circuit; and
    providing a fifth inverter with an input coupled to an output of the NAND logic gate and an output coupled to a plurality of transmission gates comprising the first and second multiplexer circuits;
    wherein the output of the NAND logic gate is also coupled to an opposing side of the plurality of transmission gates comprising the first and second multiplexers.

10. The method of claim 9, wherein when bipolar return to zero (RZ) data is received, the NAND logic gate automatically recovers clock from the bipolar RZ data without requiring a clock signal to be received.

11. The method of claim 9, wherein the output of the NAND logic gate changes a collapsible window while recovering clock from bipolar RZ data.

12. The method of claim 11, wherein changing the collapsible while recovering the clock causes a noise margin of the circuit to increase.

13. The method of claim 9, wherein the output of the NAND logic gate automatically recovers clock for bipolar RZ data received at the inputs of the first and second level shifters and received at inputs of the second and fourth inverters.

14. The method of claim 13, wherein when the bipolar RZ data is paused from being received at the inputs of the first and second level shifters and the inputs of the second and fourth inverters, the output of the NAND logic gate automatically recovers the clock when the bipolar RZ data is received again without requiring intervening training data when the bipolar RZ data is paused.

15. The method of claim 9, wherein when bipolar RZ data is received, the output of the NAND logic gate collapses a collapsible window at a time of sampling the bipolar RZ data while recovering clock from a same bipolar RZ data.

16. The method of claim 9, wherein the output of the NAND logic gate recovers clock without requiring at least one of a clock data recovery (CDR) circuit, a phase-locked loop (PLL) circuit, a serializer circuit, and a deserializer circuit in at least one of a transmitter and receiver.

17. A design structure, embodied on a non-transitory storage medium, readable by a machine used in manufacture of an integrated circuit, the design structure comprising:
a first level shifter with an output coupled to a first inverter and an input coupled to a second inverter;
a second level shifter with an input coupled to a third inverter and an output coupled to a fourth inverter;
a first multiplexer circuit with inputs coupled to outputs of the first and second inverters;
a second multiplexer circuit with inputs coupled to outputs of the third and fourth inverters;
a NAND logic gate with a first input coupled to an output of the first multiplexer circuit and a second input coupled to an output of the second multiplexer circuit; and
a fifth inverter with an input coupled to an output of the NAND logic gate and an output coupled to a plurality of transmission gates comprising the first and second multiplexer circuits;
wherein the output of the NAND logic gate is also coupled to an opposing side of the plurality of transmission gates comprising the first and second multiplexers.

18. The design structure of claim 17, wherein the design structure comprises a netlist.

19. The design structure of claim 17, wherein the design structure resides on the storage medium as a data format used for an exchange of layout data of integrated circuits.

20. The design structure of claim 17, wherein the design structure resides in a programmable gate array.

21. A hardware clock-data recovery doubler circuit for digitally encoded communications signals, comprises:
a window comparator generating a collapsible window; and
a clock output received by the window comparator as feedback;
wherein based on the clock output the window comparator circuit collapses the collapsible window while sampling input Bipolar return to zero data.

* * * * *